United States Patent
Takamatsu et al.

(10) Patent No.: US 11,029,438 B2
(45) Date of Patent: Jun. 8, 2021

(54) CAPACITIVE-COUPLING SENSOR AND METHOD FOR PRODUCING THE SAME

(71) Applicant: Sumitomo Riko Company Limited, Aichi-ken (JP)

(72) Inventors: Shigeaki Takamatsu, Aichi-ken (JP); Ryo Minoshima, Aichi-ken (JP)

(73) Assignee: SUMITOMO RIKO COMPANY LIMITED, Aichi-Ken (JP)

( * ) Notice: Subject to any disclaimer, the term of this patent is extended or adjusted under 35 U.S.C. 154(b) by 95 days.

(21) Appl. No.: 16/516,707

(22) Filed: Jul. 19, 2019

(65) Prior Publication Data
US 2019/0339412 A1 Nov. 7, 2019

Related U.S. Application Data

(63) Continuation of application No. PCT/JP2018/018768, filed on May 15, 2018.

(30) Foreign Application Priority Data

Oct. 19, 2017 (JP) .............................. JP2017-202364

(51) Int. Cl.
*G01V 3/08* (2006.01)
*B32B 5/02* (2006.01)
(Continued)

(52) U.S. Cl.
CPC .............. *G01V 3/08* (2013.01); *B32B 5/02* (2013.01); *B32B 27/12* (2013.01); *B32B 27/32* (2013.01);
(Continued)

(58) Field of Classification Search
CPC .. G01V 3/08; B32B 5/02; B32B 27/12; B32B 27/32; B32B 2264/102; B32B 2307/202;
(Continued)

(56) References Cited

U.S. PATENT DOCUMENTS

2001/0030182 A1* 10/2001 Haag .................... H05B 3/34
219/204
2012/0285008 A1* 11/2012 Akaike .................. H05K 1/038
29/825
(Continued)

FOREIGN PATENT DOCUMENTS

JP 61-196859 9/1986
JP 4-19370 2/1992
(Continued)

OTHER PUBLICATIONS

Aluminium Nitride/Aluminum Nitride (AlN)—Properties and Applications, dated Jul. 16, 2001, downloaded Dec. 17, 2020 from https://www.azom.com/article.aspx?ArticleID=610 (Year: 2001).*
(Continued)

*Primary Examiner* — Daniel R Miller
(74) *Attorney, Agent, or Firm* — Greenblum & Bernstein, P.L.C.

(57) ABSTRACT

A capacitive-coupling sensor includes: a detection electrode layer that generates capacitance between the detection electrode layer and an object to be detected; a shield electrode layer; and an insulating layer disposed between the detection electrode layer and the shield electrode layer. The insulating layer includes a thermoplastic elastomer, and the insulating layer has a thermal conductivity of 0.3 W/m·K or more and a volume resistivity of $1\times10^{12}$ Ω·cm or more. When the detection electrode layer and the shield electrode layer are made of conductive cloths, the conductive cloth for the detection electrode layer is placed on a front surface of the insulating layer and the conductive cloth for the shield electrode layer is placed on a back surface of the insulating layer forming a laminate. The laminate is pressed in a front-back direction under heating to fuse the insulating layer to the conductive cloths, producing the capacitive-coupling sensor.

20 Claims, 3 Drawing Sheets

(51) Int. Cl.
   *B32B 27/12*   (2006.01)
   *B32B 27/32*   (2006.01)
   *H03K 17/96*   (2006.01)
   *B62D 1/06*    (2006.01)

(52) U.S. Cl.
   CPC ...... *H03K 17/962* (2013.01); *B32B 2264/102* (2013.01); *B32B 2307/202* (2013.01); *B32B 2307/206* (2013.01); *B32B 2307/302* (2013.01); *B32B 2307/3065* (2013.01); *B32B 2307/536* (2013.01); *B62D 1/065* (2013.01); *H03K 2217/960765* (2013.01)

(58) Field of Classification Search
   CPC ........ B32B 2307/206; B32B 2307/302; B32B 2307/3065; B32B 2307/536; H03K 17/962; H03K 2217/960765; H03K 17/955; B62D 1/065; B62D 1/046; B62D 1/06; G01L 1/14; G01D 5/24; H05B 3/06
   See application file for complete search history.

(56) References Cited

U.S. PATENT DOCUMENTS

| | | | |
|---|---|---|---|
| 2013/0056455 A1 | 3/2013 | Onishi et al. | |
| 2014/0253151 A1* | 9/2014 | Kandler | G01L 1/26 324/686 |
| 2014/0339211 A1* | 11/2014 | Barfuss | B62D 1/065 219/202 |
| 2015/0048845 A1* | 2/2015 | Petereit | B60N 2/002 324/663 |
| 2016/0360573 A1* | 12/2016 | Bohlender | H05B 3/06 |
| 2017/0129499 A1 | 5/2017 | Odate | |
| 2017/0137050 A1* | 5/2017 | Michelmann | B62D 1/046 |
| 2017/0210409 A1* | 7/2017 | Streifinger | B62D 1/046 |
| 2017/0342235 A1* | 11/2017 | Sakamoto | C08L 9/06 |
| 2017/0355391 A1 | 12/2017 | Wittkowski et al. | |
| 2018/0022231 A1* | 1/2018 | Bennett | B60N 2/002 324/686 |
| 2018/0124875 A1* | 5/2018 | Boulbitch | B62D 1/065 |
| 2019/0217582 A1* | 7/2019 | Son | B32B 7/02 |

FOREIGN PATENT DOCUMENTS

| | | |
|---|---|---|
| JP | 2011-74537 | 4/2011 |
| JP | 2011-127053 | 6/2011 |
| JP | 2013-52775 | 3/2013 |
| JP | 2013-102143 | 5/2013 |
| JP | 2014-190856 | 10/2014 |
| JP | 2017-87883 | 5/2017 |

OTHER PUBLICATIONS

Thermoplastic Elastomer (TPE) Typical Properties Generic SEBS, downloaded Dec. 17, 2020 from https://plastics.ulprospector.com/generics/53/c/t/thermoplastic-elastomer-tpe-properties-processing/sp/18 (Year: 2020).*

Styrene-Ethylene-Butylene-Styrene Based Thermoplastic Elastomer SEBS TPE 45A, dated Sep. 14, 2001, downloaded Dec. 17, 2020 from https://www.azom.com/article.aspx?ArticleID=873 (Year: 2001).*

Official Communication issued in International Bureau of WIPO Patent Application No. PCT/JP2018/018768, dated Jul. 17, 2018 (in English).

* cited by examiner

[FIG. 1]
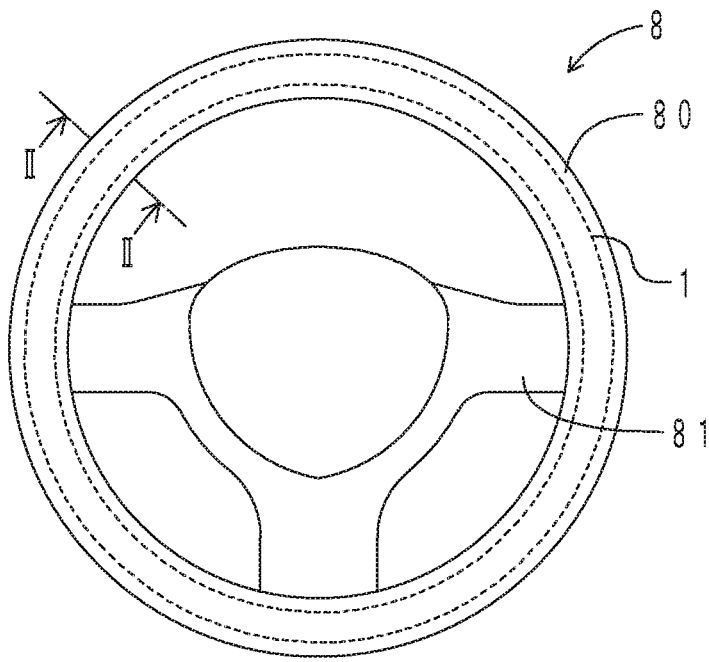
[FIG. 2]
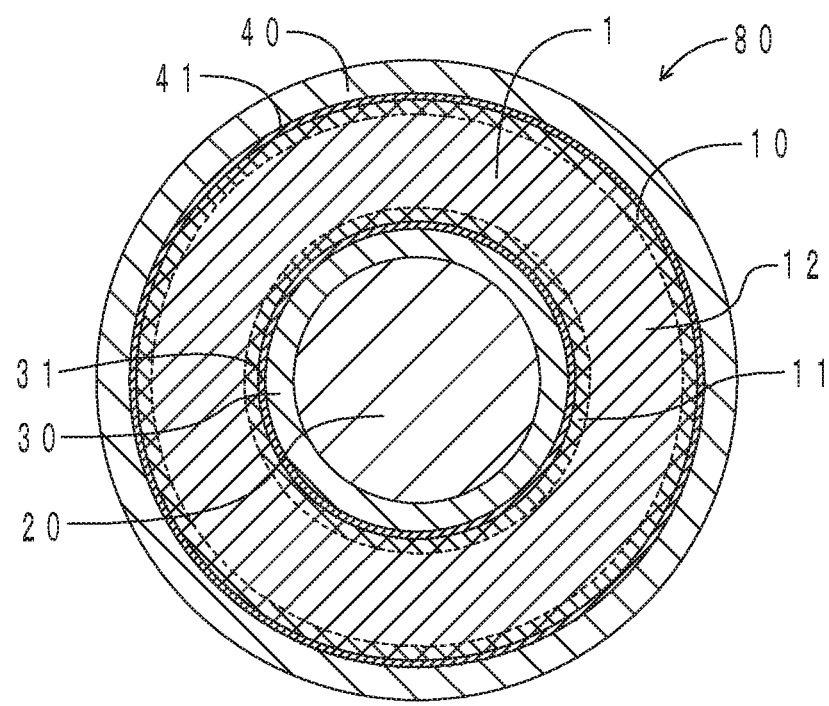

[FIG. 3]
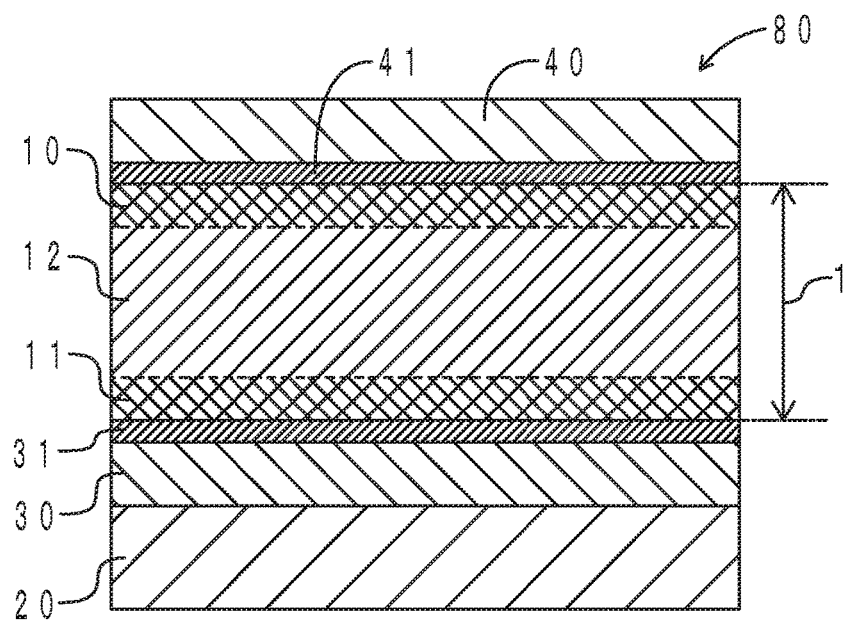
[FIG. 4]
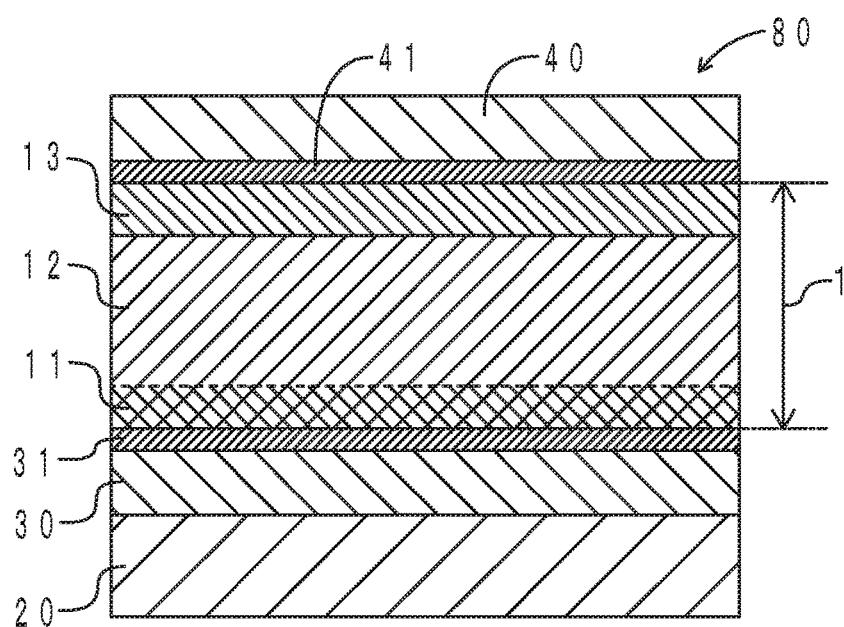

[FIG. 5]
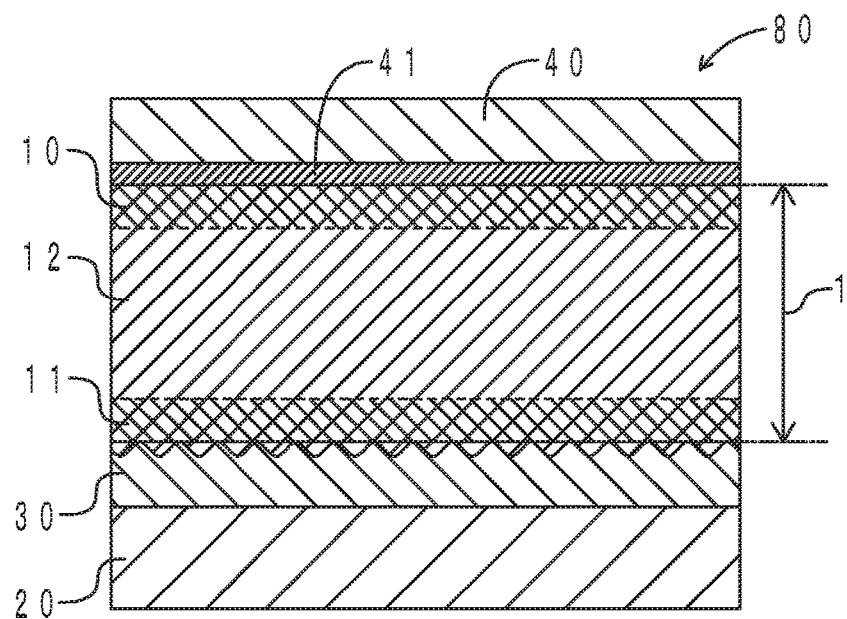
[FIG. 6]
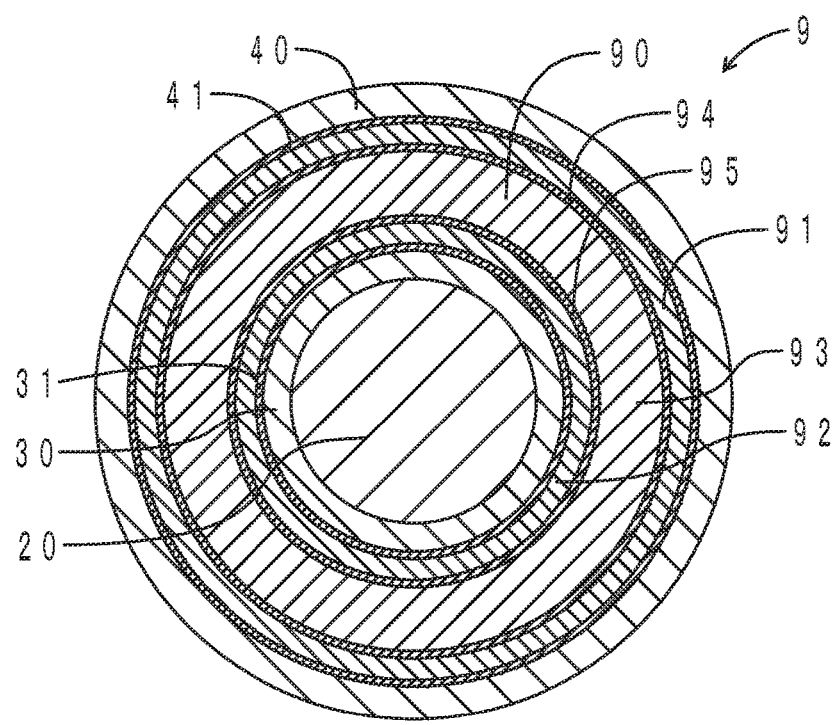

CAPACITIVE-COUPLING SENSOR AND METHOD FOR PRODUCING THE SAME

CLAIM FOR PRIORITY

This application is a Continuation of PCT/JP2018/018768 filed May 15, 2018, the contents of which is expressly incorporated by reference herein in its entirety.

BACKGROUND

1. Technical Field

The invention relates to a capacitive coupling sensor that is disposed in a steering wheel, interior parts or the like of a vehicle, and that can detect proximity, contact or the like of a human.

2. Description of Related Art in vehicles, such as automobiles, various sensors that detect a state of an occupant are installed. For example, Patent Documents 1 and 2 disclose contact sensors disposed on a rim portion (grip) of a steering wheel. The contact sensor includes a shield layer and a sensor layer, and detects whether a driver has touched the steering wheel based on a change in capacitance generated between the occupant and the sensor layer. The rim portion becomes cold in winter and cold regions. There is a known steering wheel in which a heater is installed in a rim portion in order to reduce the difficulty in driving and the discomfort due to the coldness. In the steering wheels described in Patent Documents 1 and 2, the heater is disposed under (on a core side of) the contact sensor.

Patent Document 1: Japanese Unexamined Patent Application Publication No. 2017-87883 (JP 2017-087883 A)

Patent Document: Japanese Unexamined Patent Application Publication No. 2014-190856 (JP 2014-190856 A)

Patent Document 3: Japanese Unexamined Patent Application Publication No. 61-196859 (JP 61-196859 A)

SUMMARY

FIG. 6 shows a radial sectional view of a conventional steering wheel provided with a contact sensor and a heater. As shown in FIG. 6, the steering wheel 9 includes a core 20, a heater layer 30, a contact sensor 90, and an upholstery 40. The steering wheel 9 has a layered structure in which a plurality of layers are stacked radially outward from the core 20. The heater layer 30 covers an outer peripheral surface of the core 20. The contact sensor 90 covers an outer peripheral surface of the heater layer 30. The upholstery 40 covers an outer peripheral surface of the contact sensor 90. The driver touches the upholstery 40.

The contact sensor 90 includes a detection electrode layer 91, a shield electrode layer 92, and an insulating layer 93. The detection electrode layer 91 is disposed on the upholstery 40 side, and capacitance is generated between the detection electrode layer 91 and the driver's hand (an object to be detected). The shield electrode layer 92 is disposed on the heater layer 30 side and blocks noise from the heater layer 30. The insulating layer 93 is disposed between the detection electrode layer 91 and the shield electrode layer 92. An adhesive layer 94 is disposed between the detection electrode layer 91 and the insulating layer 93. An adhesive layer 95 is disposed between the shield electrode layer 92 and the insulating layer 93. Each of the adhesive layers 94 and 95 bonds two layers adjoining thereto. Similarly, an adhesive layer 31 is disposed between the heater layer 30 and the shield electrode layer 92. The adhesive layer 31 bonds the heater layer 30 and the shield electrode layer 92. An adhesive layer 41 is disposed between the upholstery 40 and the detection electrode layer 91. The adhesive layer 41 bonds the upholstery 40 and the detection electrode layer 91.

In order to improve the tactile sensation when the driver grips the steering wheel 9, a foamed resin such as polyethylene foam is used for the insulating layer 93. However, the thermal conductivity of the foamed resin is as small as about 0.04 W/m·K. In addition, the thermal conductivity of the adhesive layers 31, 41, 94, 95 for bonding the layers to be laminated is also small. Thus, even if the steering wheel is heated with the heater layer 30, it takes time until the heat is transmitted to the upholstery 40 and a driver is not able to feel warmth quickly. Moreover, since the layers are bonded with an adhesive, a process of applying the adhesive is required and the number of production processes accordingly increases, thereby increasing the cost.

The invention has been made in view of such circumstances, and it is an object of the invention to provide a capacitive-coupling sensor having a good tactile sensation and a thermal conductivity higher than that of the related art. Another object of the invention is to provide a production method that allows production of the capacitive-coupling sensor at low cost.

(1) In order to solve the above problems, a capacitive-coupling sensor according to the invention is characterized by including: a detection electrode layer that generates capacitance between the detection electrode layer and an object to be detected; a shield electrode layer; and an insulating layer disposed between the detection electrode layer and the shield electrode layer, wherein the insulating layer includes a thermoplastic elastomer, and the insulating layer has a thermal conductivity of 0.3 W/m·K or more, and a volume resistivity of $1\times10^{12}$ Ω·cm or more.

(2) In order to solve the above problems, a method for producing a capacitive-coupling sensor of the present invention is a method for producing the capacitive-coupling sensor, in which the detection electrode layer and the shield electrode layer are made of conductive cloths, and at least part of the conductive cloths is embedded in the insulating layer. The method is characterized by including: a stacking step of placing the conductive cloth that serves as the detection electrode layer on a front surface of the insulating layer and placing the conductive cloth that serves as the shield electrode layer on a back surface of the insulating layer to form a laminate; and a fusing step of fusing the insulating layer to the conductive cloths by pressing the laminate in a front-back direction under heating.

(1) In the capacitive-coupling sensor of the invention, a thermoplastic elastomer is used for the insulating layer. Thermoplastic elastomers are flexible. Therefore, even if the sensor is disposed in a member that people touch, the tactile sensation is less likely to degrade. In addition, the volume resistivity of the insulating layer is large. Therefore, the insulation between the detection electrode layer and the shield electrode layer can be sufficiently ensured, which reduces possibility that the sensor function will be inhibited. Further, the thermal conductivity of the insulating layer is larger than that of the related art. Therefore, the thermal conductivity of the sensor is higher than that in the related art. Therefore, for example, when the capacitive-coupling sensor of the invention is disposed outward of the heater layer in the steering wheel, the heat of the heater layer can be quickly transmitted to the upholstery and the time required to warm up the steering wheel can be shortened.

The insulating layer includes a thermoplastic elastomer. Therefore, when the electrode layers to be stacked are made of conductive rubber, it is possible to fix, without using an adhesive, the electrode layers and the insulating layer utilizing the adhesion of the thermoplastic elastomer and the conductive rubber. In addition, the thermoplastic elastomer is softened by heating. Therefore, for example, when the electrode layers to be stacked are made of conductive cloths having a number of voids, it is possible to fix, without using an adhesive, the electrode layers and the insulating layer by bonding the electrode layers and the insulating layer by thermal compression bonding and causing the softened insulating layer to enter the voids of the electrode layers. As described above, with the capacitive-coupling sensor of the invention, it is not necessary to use an adhesive for fixing the layers. Therefore, the production process can be reduced, thereby reducing the cost.

Patent Document 3 describes a configuration in which a heating body composed of a positive characteristic thermistor is disposed in a steering wheel, and the outer side of the heating body is covered with a heat dissipation layer made of a synthetic resin excellent in thermal conductivity. However, the heat dissipation layer described in Patent Document 3 is not a member that constitutes a sensor. Therefore, the heat dissipation layer is formed by blending a conductive metal filler with a synthetic resin, and thus has conductivity. Thus, the heat dissipation layer can not be used as an insulating layer of a capacitive-coupling sensor. Further, in Patent Document 3, a thermoplastic elastomer is not mentioned as a material of the heat dissipation layer.

(2) In the method for producing the capacitive-coupling sensor of the invention, the capacitive-coupling sensor of the invention in which the detection electrode layer and shield electrode layer are made of conductive cloths. The thermoplastic elastomer contained in the insulating layer is softened by heating. The conductive cloth has a number of voids between the fibers. Therefore, when the conductive cloths are placed on the insulating layer and bonded by thermal compression bonding, the conductive cloths are impregnated with the softened insulating layer and at least part of the conductive cloths is embedded in the insulating layer. Thus, the insulating layer and the conductive cloths (detection electrode layer and shield electrode layer) can be fixed without using an adhesive. The production method of the invention facilitates production of the capacitive-coupling sensor of the invention, in which at least part of the conductive cloth that serves as the detection electrode layer and at least part of the conductive cloth that serves as the shield electrode layer are embedded in the insulating layer.

BRIEF DESCRIPTION OF THE DRAWINGS

FIG. 1 is a front view of a steering wheel in which a capacitive-coupling sensor according to a first embodiment is disposed.

FIG. 2 is a cross-sectional view taken along the line II-II in FIG. 1.

FIG. 3 is a schematic cross-sectional view for explaining a layered structure of the steering wheel.

FIG. 4 is a schematic cross-sectional view for explaining a layered structure of a steering wheel in which a capacitive-coupling sensor according to a second embodiment is disposed.

FIG. 5 is a schematic cross-sectional view for explaining a layered structure of a steering wheel in which a capacitive-coupling sensor according to a third embodiment is disposed.

FIG. 6 is a radial cross-sectional view of a steering wheel of the related art.

DETAILED DESCRIPTION OF THE EMBODIMENTS

Hereinafter, embodiments of a capacitive-coupling sensor and a method for producing the capacitive-coupling sensor according to the invention will be described.

First Embodiment

[Configuration]

First, the configuration of the capacitive-coupling sensor according to the present embodiment will be described. FIG. 1 shows a front view of a steering wheel in which the capacitive-coupling sensor of the present embodiment is disposed. FIG. 2 shows a cross-sectional view taken along the line II-II of FIG. 1. FIG. 3 shows a cross-sectional schematic diagram for explaining a layered structure of the steering wheel.

As shown in FIG. 1, a steering wheel 8 has a rim portion 80 and a connecting portion 81. The rim portion 80 has an annular shape and is gripped by a driver. The connecting portion 81 connects the rim portion 80 and a steering shaft (not shown). As shown by dotted lines in FIG. 1, a capacitive-coupling sensor 1 is disposed in the rim portion 80.

As shown in FIGS. 2 and 3, the rim portion 80 includes a core 20, a heater layer 30, the capacitive-coupling sensor 1, and an upholstery 40.

The core 20 is a solid rod made of metal and has an annular shape. The core 20 is connected to the steering shaft via the connecting portion 81.

The heater layer 30 is made of non-woven fabric in which heating wires are disposed. The heater layer 30 covers an outer peripheral surface of the core 20. The heater layer 30 heats the rim portion 80 when the heating wire generates heat by energization. An adhesive layer 31 is disposed between the heater layer 30 and the capacitive-coupling sensor 1. The adhesive layer 31 bonds the heater layer 30 and the capacitive-coupling sensor 1 (specifically, a shield electrode layer 11 described later).

The capacitive-coupling sensor 1 has a flexible sheet shape. The capacitive-coupling sensor 1 is wound (one turn) around the core 20 with the heater layer 30 interposed therebetween. The capacitive-coupling sensor 1 covers an outer peripheral surface of the heater layer 30. The capacitive-coupling sensor 1 includes a detection electrode layer 10, the shield electrode layer 11, and an insulating layer 12.

The detection electrode layer 10 is made of a conductive cloth. A volume resistivity of the detection electrode layer 10 is on the order of 10–2 Ω·cm. The detection electrode layer 10 is disposed on the upholstery 40 side, and capacitance is generated between the detection electrode layer 10 and the driver's hand (an object to be detected). Almost the entire detection electrode layer 10 is embedded in the insulating layer 12 as shown by dotted lines in FIGS. 2 and 3. The shield electrode layer 11 is made of the same conductive cloth as the detection electrode layer 10. The shield electrode layer 11 is disposed on the heater layer 30 side. The shield electrode layer 11 is grounded and blocks noise from the heater layer 30. Almost the entire shield electrode layer 11 is embedded in the insulating layer 12 as shown by dotted lines in FIGS. 2 and 3.

The insulating layer 12 is disposed between the detection electrode layer 10 and the shield electrode layer 11. The insulating layer 12 includes a styrene-based elastomer, an olefin-based elastomer, and magnesium oxide particles. A thermal conductivity of the magnesium oxide particles is 45 W/m·K. The magnesium oxide particles are included in the concept of the inorganic filler in the invention. A thermal conductivity of the insulating layer 12 is 0.5 W/m·K, and a volume resistivity of the insulating layer 12 is $1 \times 10^{13}$ Ω·cm. A type A durometer hardness of the insulating layer 12 is 56.

The upholstery 40 is made of resin and covers an outer peripheral surface of the capacitive-coupling sensor 1. An adhesive layer 41 is disposed between the upholstery 40 and the capacitive-coupling sensor 1. The adhesive layer 41 bonds the upholstery 40 and the capacitive-coupling sensor 1 (specifically, the detection electrode layer 10).

[Production Method]

Next, a method of producing the capacitive-coupling sensor according to the present embodiment will be described. First, the conductive cloth for the detection electrode layer 10 is placed on a front surface of the insulating layer 12, and the conductive cloth for the shield electrode layer 11 is placed on a back surface of the insulating layer 12 to form a laminate (stacking step). Next, the laminate is subjected to hot pressing. Thus, the conductive cloths are impregnated with the softened insulating layer 12, and the insulating layer 12 is fused to the conductive cloths (fusing step). At the same time, the conductive cloths (the detection electrode layer 10 and the shield electrode layer 11) are embedded in the insulating layer 12. Thus, the capacitive-coupling sensor 1 is produced.

The produced capacitive-coupling sensor 1 is disposed, with the shield electrode layer 11 on the inner side, so as to cover an outer peripheral surface of the heater layer 30 wound around the core 20. An adhesive is applied to a front surface of the heater layer 30. Thus, the heater layer 30 and the shield electrode layer 11 are bonded. Then, the upholstery 40 is disposed so as to cover the detection electrode layer 10. An adhesive is applied to a back surface of the upholstery 40. Accordingly, the upholstery 40 and the detection electrode layer 10 are bonded. Thus, the rim portion 80 of the steering wheel 8 is produced.

[Operation of Capacitive-Coupling Sensor]

Next, the operation of the capacitive-coupling sensor according to the present embodiment will be described. When the driver's hand (electrically conductive and grounded through the human body) comes close to the upholstery 40, capacitance is generated between the detection electrode layer 10 and the hand. A detection circuit (not shown) is electrically connected to the detection electrode layer 10. The detection circuit calculates an amount of change in capacitance between the state where the hand is not close to the upholstery 40 and the state where the hand is close to the upholstery 40, and determines whether the driver has touched the steering wheel 8 based on the calculated value.

[Functions and Effects]

Next, functions and effects of the capacitive-coupling sensor of the present embodiment and the method for producing the capacitive-coupling sensor will be described. In the capacitive-coupling sensor 1, flexible thermoplastic elastomers (styrene-based elastomer and olefin-based elastomer) are used for the insulating layer 12. The detection electrode layer 10 and the shield electrode layer 11 are each made of a flexible conductive cloth. Therefore, the capacitive-coupling sensor 1 as a whole is flexible, and the tactile sensation of the rim portion 80 is good. Moreover, the volume resistivity of the insulating layer 12 is large. Thus, the insulation between the detection electrode layer 10 and the shield electrode layer 11 can be sufficiently ensured, and the sensor function is less likely to be inhibited. Moreover, the thermal conductivity of the insulating layer 12 is large compared with insulating layers of related art. In addition, there is no adhesive layer between the insulating layer 12 and the detection electrode layer 10 and between the insulating layer 12 and the shield electrode layer 11. Thus, the thermal conductivity of the capacitive-coupling sensor 1 is higher than that of the related art. Therefore, the heat from the heater layer 30 can be quickly transmitted to the upholstery 40, and a temperature rise time of the rim portion 80 can be shortened. As a result, even when driving in winter or in a cold region, the driver can quickly feel warmth, thereby reducing the difficulty and discomfort in driving.

In the capacitive-coupling sensor 1, the thermoplastic elastomers are used for the insulating layer 12. Therefore, the detection electrode layer 10 and the shield electrode layer 11 can be fixed, without using an adhesive, to the insulating layer 12 utilizing the softening of the thermoplastic elastomers due to the heating. The detection electrode layer 10 and the shield electrode layer 11 are both made of a conductive cloth. Thus, according to the method for producing the capacitive-coupling sensor of the present embodiment, two conductive clothes are impregnated with the insulating layer 12 by hot pressing with the insulating layer 12 sandwiched between the conductive cloths, so that the detection electrode layer 10 and the shield electrode layer 11 can be fixed to the insulating layer 12. As a result, the step of applying an adhesive, which has been conventionally required, becomes unnecessary, and the number of production steps is reduced so that the cost can be accordingly reduced.

Second Embodiment

The difference between the capacitive-coupling sensor according to the present embodiment and the capacitive-coupling sensor according to the first embodiment is that the detection electrode layer is made of conductive rubber rather than the conductive cloth. The difference between the production method of the capacitive-coupling sensor of the present embodiment and the production method of the capacitive-coupling sensor of the first embodiment is that the detection electrode layer is bonded by pressure to the insulating layer separately from the shield electrode layer, which will be mainly described here.

FIG. 4 is a schematic cross-sectional view for explaining a layered structure of the steering wheel in which the capacitive-coupling sensor of the present embodiment is disposed. FIG. 4 corresponds to FIG. 3, and parts in FIG. 4 that are the same as those in FIG. 3 are denoted by the same reference symbols.

As shown in FIG. 4, the rim portion 80 includes the core 20, the heater layer 30, the capacitive-coupling sensor 1, and the upholstery 40. The capacitive-coupling sensor 1 includes the detection electrode layer 13, the shield electrode layer 11, and the insulating layer 12. The detection electrode layer 13 is made of conductive rubber having an elastomer and a conductive material. The volume resistivity of the detection electrode layer 13 is on the order of $10^{-2}$ Ω·cm. The detection electrode layer 13 is fixed to the front surface (surface on the radially outer side) of the insulating layer 12.

The capacitive-coupling sensor 1 is produced as follows. First, a conductive cloth for the shield electrode layer 11 is placed on the back surface of the insulating layer 12 and subjected to hot pressing. As a result, the conductive cloth is impregnated with the softened insulating layer 12, and the insulating layer 12 is fused to the conductive cloth. At the same time, the conductive cloth (shield electrode layer 11) is embedded in the insulating layer 12 as shown by a dotted line in FIG. 4. Next, conductive rubber for the detection electrode layer 13 is placed on the front surface of the insulating layer 12 and pressed. As a result, the detection electrode layer 13 and the insulating layer 12 are fixed due to the adhesiveness of the thermoplastic elastomer contained in the insulating layer 12 and the conductive rubber.

The capacitive-coupling sensor according to the present embodiment and the method for producing the capacitive-coupling sensor provide similar functions and effects as those provided by the capacitive-coupling sensor and the method for producing the capacitive-coupling sensor according to the first embodiment, regarding the parts having the same configurations.

According to the present embodiment, the detection electrode layer 13 is made of conductive rubber. Thus, the detection electrode layer 13 and therefore the capacitive-coupling sensor 1 as a whole become more flexible, so that the tactile sensation of the rim portion 80 is improved. Moreover, when fixing the detection electrode layer 13 and the insulating layer 12, the adhesiveness of the thermoplastic elastomer contained in the insulating layer 12 and the conductive rubber. Therefore, it is not necessary to heat the detection electrode layer 13 and the insulating layer 12 (of course, an adhesive is not necessary).

Third Embodiment

A capacitive-coupling sensor of the present embodiment is the same as the capacitive-coupling sensor of the first embodiment. However, a rim portion of the steering wheel according to the present embodiment is different from the rim portion according to the first embodiment in that no adhesive layer is disposed between the capacitive-coupling sensor and the heater layer, which will be mainly described here.

FIG. 5 is a schematic cross-sectional view for explaining a layered structure of the steering wheel in which the capacitive-coupling sensor of the present embodiment is disposed. FIG. 5 corresponds to FIG. 3, and parts in FIG. 5 that are the same as those in FIG. 3 are denoted by the same reference symbols.

As shown in FIG. 5, the rim portion 80 includes the core 20, the heater layer 30, the capacitive-coupling sensor 1, and the upholstery 40. The capacitive-coupling sensor 1 includes the detection electrode layer 13, the shield electrode layer 11, and the insulating layer 12. Almost the entire shield electrode layer 11 is embedded in the insulating layer 12 as shown by a dotted line in FIG. 5. That is, the shield electrode layer 11 is impregnated with the insulating layer 12. Furthermore, a surface layer portion of the heater layer 30 is also impregnated with the insulating layer 12, as shown by a wavy line in FIG. 5. Thus, the capacitive-coupling sensor 1 is fixed to the heater layer 30. No adhesive layer is disposed between the capacitive-coupling sensor 1 and the heater layer 30.

The rim portion 80 of the present embodiment is produced as follows. First, a conductive cloth for the detection electrode layer 10 is placed on the front surface of the insulating layer 12, and a conductive cloth for the shield electrode layer 11 and a non-woven fabric for the heater layer 30 are stacked in this order on the back surface of the insulating layer 12 to form a laminate. Next, the laminate is subjected to hot pressing. Thus, the conductive cloths and the non-woven fabric are impregnated with the softened insulating layer 12, and the insulating layer 12 is fused to the conductive cloths and the non-woven fabric. At the same time, the conductive cloths (the detection electrode layer 10 and the shield electrode layer 11) are embedded in the insulating layer 12. As a result, the heater layer 30 and the capacitive-coupling sensor 1 are fixed. Then, the heater layer 30 to which the capacitive-coupling sensor 1 is fixed is wound around the outer peripheral surface of the core 20. Finally, the upholstery 40 is disposed to cover the detection electrode layer 10. An adhesive is applied to a back surface of the upholstery 40. Accordingly, the upholstery 40 and the detection electrode layer 10 are bonded. Thus, the rim portion 80 of the steering wheel 8 is produced.

The present embodiment provides the similar functions and effects as those provided by the first embodiment, regarding the parts having the same configurations. According to the present embodiment, not only the detection electrode layer 10 and the shield electrode layer 11 constituting the capacitive-coupling sensor 1 but also the heater layer 30 is fixed together utilizing the softening of the thermoplastic elastomer contained in the insulating layer 12 due to heating. The detection electrode layer 10 and the shield electrode layer 11 are made of conductive cloths, and the heater layer 30 is made of a non-woven fabric. That is, the detection electrode layer 10, the shield electrode layer 11, and the heater layer 30 are all made of a sheet-like cloth member. Therefore, by stacking the cloth members on the insulating layer 12 and performing hot pressing, the cloth members can be impregnated with the insulating layer 12 and the layers can be fixed to each other without using an adhesive. Thus, the step of applying an adhesive can be eliminated, thereby reducing the cost.

Other Embodiments

The embodiments of the capacitive-coupling sensor and the method for producing the capacitive-coupling sensor according to the invention have been described above. However, embodiments are not specifically limited to those described above. The invention can be implemented with a variety of modifications and alterations that can be achieved by a person skilled in the art.

[Insulating Layer]

The thermoplastic elastomer used for the insulating layer is not particularly limited. The thermoplastic elastomer may be suitably selected from elastomers such as styrene-based, olefin-based, vinyl chloride-based, urethane-based, ester-based and amide-based elastomers. The thermoplastic elastomers may be used alone or in combination of two or more. Examples of the styrene-based thermoplastic elastomer include SBS, SEBS, and SEPS. Examples of the olefin-based elastomer include EEA, EMA, and EMMA, as well as a copolymer of ethylene and α-olefin (ethylene-octene copolymer).

The insulating layer may contain rubber other than the thermoplastic elastomers or resin. For example, when the insulating layer contains rubber such as ethylene-propylene rubber (EPM, EPDM), the flexibility of the insulating layer is improved. In terms of improving the flexibility of the insulating layer, the insulating layer may contain a flexibility-imparting component such as a plasticizer.

The thermal conductivity of the insulating layer is 0.3 W/m·K or more. The thermal conductivity is preferably 0.4 W/m·K or more, and more preferably 0.5 W/m·K or more. In terms of increasing the thermal conductivity of the insulating layer, the insulating layer preferably has an inorganic filler having a relatively high thermal conductivity and an insulating property. The thermal conductivity of the inorganic filler used to increase the thermal conductivity of the insulating layer is preferably 20 W/m·K or more. Examples of the inorganic filler with relatively high thermal conductivity include magnesium oxide, aluminum oxide, aluminum nitride, boron nitride, and silicon carbide.

Further, in terms of imparting flame retardancy to the insulating layer, the insulating layer preferably has an inorganic filler that is flame retardant and has an insulating property. Examples of the inorganic filler contained in the insulating layer include magnesium hydroxide, aluminum hydroxide, and boron nitride.

It is desirable that the insulating layer be flexible in order to improve the tactile sensation of the sensor. For example, the type A durometer hardness of the insulating layer is preferably 35 or more and less than 90. The hardness of 90 or more makes the insulating layer hard to the touch, thereby degrading the tactile sensation. In contrast, the hardness of less than 35 makes the insulating layer too soft to be handled, so that the workability such as assemblability is reduced. Further, in terms of improving the assemblability and durability, the tensile strength of the insulating layer is preferably 0.1 MPa or more, and more preferably 2.0 MPa or more. The breaking elongation of the insulating layer is preferably 100% or more, and more preferably 500% or more.

In terms of securing the insulation between the detection electrode layer and the shield electrode layer and maintaining the sensor function, the volume resistivity of the insulating layer is $1 \times 10^{12}$ Ω·cm or more. The volume resistivity is preferably $1 \times 10^{13}$ Ω·cm or more. The insulating layer is disposed between the detection electrode layer and the shield electrode layer. The insulating layer need only be interposed between the two electrode layers, and the electrode layers may be impregnated with the insulating layer or may not be impregnated with the insulating layer while merely contacting the insulating layer.

When the insulating layer is formed by extrusion, a plate-like filler may be contained in order to improve the flowability of a material such as a thermoplastic elastomer. As the plate-like filler, a material with high insulating property such as talc or boron nitride may be used.

[Detection Electrode Layer]

The detection electrode layer is desirably conductive and flexible. The volume resistivity of the detection electrode layer is preferably less than 10 Ω·cm. The volume resistivity is more preferably 1 Ω·cm or less. The detection electrode layer may be formed of conductive rubber or a conductive cloth.

The conductive rubber has an elastomer and a conductive material. As the elastomer, one or more selected from crosslinked rubber such as acrylic rubber, silicone rubber, urethane rubber, urea rubber, fluororubber, nitrile rubber, and hydrogenated nitrile rubber, and thermoplastic elastomers may be used. The conductive material may be appropriately selected from metal particles of silver, gold, copper, nickel, rhodium, palladium, chromium, titanium, platinum, iron and alloys thereof etc., metal oxide particles of zinc oxide, titanium oxide etc., metal carbide particles of titanium carbonate, etc., metal nanowires of silver, gold, copper, platinum, nickel, etc., conductive carbon materials such as carbon black, carbon nanotubes, graphite, thin-layer graphite, graphene, etc. The conductive rubber may contain a crosslinking agent, a crosslinking accelerator, a dispersing agent, a reinforcing material, a plasticizer, an antiaging agent, a coloring agent and the like.

As the conductive cloth, woven fabric, non-woven fabric or the like made of conductive fibers may be used. Examples of the conductive fibers include a polyester fiber such as polyethylene terephthalate (PET) which is plated with copper, nickel or the like having high conductivity.

[Shield Electrode Layer]

The shield electrode layer desirably has high conductivity in terms of shielding the detection electrode layer from noise. The volume resistivity of the shield electrode layer is preferably less than $1 \times 10^{-1}$ Ω·cm. The material of the shield electrode layer may be the same as or different from that of the detection electrode layer. In order to achieve both high conductivity and flexibility, it is desirable that the shield electrode layer be formed of the above-mentioned conductive cloth.

[Production Method]

In order to fix the detection electrode layer and the shield electrode layer to the insulating layer, pressure may be applied while heating, as necessary, with at least one of the detection electrode layer and the shield electrode layer placed on the insulating layer. Alternatively, the insulating layer may be divided into two in the thickness direction to prepare a first insulating layer and a second insulating layer. Then, the detection electrode layer may be fixed to the first insulating layer, and the shield electrode layer may be fixed to the second insulating layer, followed by stacking and bonding together the first insulating layer and the second insulating layer by pressure.

In the above-described embodiment, the capacitive-coupling sensor and the upholstery and the heater layer (counterpart members) stacked thereon are bonded with an adhesive. The type of the adhesive is not particularly limited. Examples of the adhesive include an acrylic adhesive. Alternatively, the thermoplastic resin having a type A durometer hardness of less than 35 and tackiness as well as having a thermal conductivity of 0.3 W/m·K or more may be disposed and fixed by adhesion.

[Use]

Examples of the object to be detected by the capacitive-coupling sensor according to the invention include a human hand. The capacitive-coupling sensor according to the invention is preferably disposed on interior parts such as door trims, arm rests, console boxes, instrument panels, headrests, and seats, as well as the steering wheel of the vehicle to detect proximity and contact of a human. When the capacitive-coupling sensor according to the invention is disposed in the steering wheel as in the above embodiments, the heater does not necessarily have to be disposed in the rim portion.

EXAMPLES

Next, the invention will be more specifically described by way of examples.

<Production of Capacitive-Coupling Sensor>

Example 1

First, to 100 parts by mass of styrene-based thermoplastic elastomer (SEBS) ("Toughtec (registered trademark) H1221" manufactured by Asahi Kasei Corporation) And 50 parts by mass of olefin-based thermoplastic elastomer ("EN- GAGE (registered trademark) XLT 8677" manufactured by Dow Chemical Japan Limited), 200 parts by mass of magnesium oxide powder ("RF-50SC" manufactured by Ube Materials Industries., Ltd., thermal conductivity: 45 W/m·K) as an inorganic filler was added, and then mixed and kneaded using a twin-screw extruder for compounding ("TEX (registered trademark) 25αIII" manufactured by Japan Steel Works, Ltd.) At a temperature of 200° C., to produce a compound in pellets. Next, the compound was subjected to t-die extrusion processing using a single-screw extruder ("UT-25" manufactured by Research Laboratory of Plastics Technology, Co., Ltd.) to produce an elastomer sheet of 150 mm wide and 1 mm thick. Subsequently, the elastomer sheet was cut into a piece with a predetermined length, and was sandwiched between two conductive cloths ("Sui-10-511M" manufactured by Seiren Co., Ltd.) to prepare a laminate. Then, the laminate was subjected to hot pressing using a press molding machine (150-ton press machine manufactured by Sanyu Industries Co., Ltd.) to fuse the conductive cloths on both sides of the elastomer sheet in the thickness direction. Thus, a capacitive-coupling sensor (hereinafter simply referred to as "sensor") composed of a conductive cloth (detection electrode layer)/an elastomer sheet (insulation layer)/a conductive cloth (shield electrode layer) was produced. In the produced sensor, the conductive cloths were almost entirely embedded in the elastomer sheet.

Example 2

A sensor of Example 2 was produced in the same manner as in Example 1 except that the amount of styrene-based thermoplastic elastomer was changed to 50 parts by mass and the amount of olefin-based thermoplastic elastomer was changed to 100 parts by mass.

Example 3

A sensor of Example 3 was produced in the same manner as in Example 1 except that 50 parts by mass of low density polyethylene (LDPE, "EXCELLEN (registered trademark) GH030" manufactured by Sumitomo Chemical Co., Ltd.) was used in place of the olefin-based thermoplastic elastomer.

Example 4

A sensor of Example 4 was produced in the same manner as in Example 1 except that the amount of magnesium oxide powder was changed to 300 parts by mass.

Example 5

A sensor of Example 5 was produced in the same manner as in Example 1 except that the amount of magnesium oxide powder was changed to 150 parts by mass, and 150 mass of magnesium hydroxide powder ("KISUMA (registered trademark) 5" manufactured by Kyowa Chemical Industry Co., Ltd.) as an inorganic filler having flame retardancy was added thereto, to produce a compound.

Example 6

A sensor of Example 6 was produced in the same manner as in Example 1 except that 150 parts by mass of magnesium hydroxide powder (same as above) was added, in addition to the magnesium oxide powder, as an inorganic filler having flame retardancy, to produce a compound.

Comparative Example 1

A sensor of Comparative Example 1 was produced in the same manner as in Example 1 except that magnesium oxide powder was added to 150 parts by mass of low density polyethylene (same as above) to produce a compound without using a styrene-based thermoplastic elastomer and an olefin-based thermoplastic elastomer. Also in the sensor of Comparative Example 1, the conductive cloth of the electrode layer was almost entirely embedded in the elastomer sheet.

Comparative Example 2

A sensor of Comparative Example 2 was produced in the same manner as in Example 1 except that the magnesium oxide powder was not used.

Comparative Example 3

A sensor of Comparative Example 3 was produced in the same manner as in Example 1 except that 15 parts by mass of carbon black ("#3030B" manufactured by Mitsubishi Chemical Corporation) was used in place of magnesium oxide powder.

<Measurement of Physical Properties of Insulating Layer>

The type A durometer hardness, the thermal conductivity, the volume resistivity, the tensile strength, and the breaking elongation of each elastomer sheet (hereinafter, referred to as "insulation layer") constituting each of the sensors of Examples and Comparative Examples were measured. The measuring method is as follows.

[Type A Durometer Hardness]

Using a hardness tester ("ASKER P1-type A" manufactured by Kobunshi Keiki Co., Ltd.) in accordance with JIS K6253-3: 2012, the type A durometer hardness was measured by stacking three 1-mm thick insulating layers. As the type A durometer hardness, an instantaneous value immediately after the contact between the needle and the insulating layer was adopted.

[Thermal Conductivity]

The thermal conductivity was measured using "HC-110" manufactured by Eko Instruments in accordance with the heat flow meter method of JIS A 1412-2: 1999.

[Volume Resistivity]

The volume resistivity was measured using "High Voltage Source Measure Unit 237" manufactured by Keithley Instruments in accordance with the parallel terminal electrode method of JIS K 6271-2: 2015. The applied voltage was 100 V.

[Tensile Strength and Breaking Elongation]

The tensile test prescribed in JIS K6251: 2017 was performed to measure the tensile strength and the breaking elongation. The breaking elongation is the same as the elongation at break (EB) specified in JIS K6251: 2017. The tensile test was performed using a dumbbell-shaped No. 5 test piece at a pulling rate of 100 mm/min.

Table 1 collectively shows the components of each insulating layer and the measurement results of physical properties thereof.

TABLE 1

|  |  | Example 1 | Example 2 | Example 3 | Example 4 | Example 5 | Example 6 | Comparative Example 1 | Comparative Example 2 | Comparative Example 3 |
|---|---|---|---|---|---|---|---|---|---|---|
| Thermoplastic elastomer | Styrene-based | 100 | 50 | 100 | 100 | 100 | 100 | — | 100 | 100 |
|  | Olefin-based | 50 | 100 | — | 50 | 50 | 50 | — | 50 | 50 |
| Inorganic filler | Magnesium oxide | 200 | 200 | 200 | 300 | 150 | 200 | 200 | — | — |
|  | Magnesium hydroxide | — | — | — | — | 150 | 150 | — | — | — |
| Others | Low density polyethylene | — | — | 50 | — | — | — | 150 | — | — |
|  | Carbon black | — | — | — | — | — | — | — | — | 15 |
| Evaluation Results | Type A durometer hardness | 67 | 56 | 65 | 76 | 79 | 83 | 90 | 55 | 57 |
|  | Thermal conductivity [W/m · K] | 0.49 | 0.50 | 0.50 | 0.75 | 0.52 | 0.65 | 0.50 | 0.02 | 0.02 |
|  | Volume resistivity [Ω · cm] | $1 \times 10^{13}$ | $1 \times 10^{13}$ | $1 \times 10^{13}$ | $1 \times 10^{13}$ | $1 \times 10^{14}$ | $1 \times 10^{14}$ | $1 \times 10^{13}$ | $1 \times 10^{13}$ | $1 \times 10^{4}$ |
|  | Tensile strength [MPa] | 2.7 | 2.8 | 5.1 | 2.5 | 2.9 | 2.6 | 25.0 | 3.0 | 2.6 |
|  | Breaking elongation [%] | 1020 | 800 | 680 | 980 | 640 | 400 | 400 | 1080 | 960 |

As shown in table 1, the thermal conductivities and the volume resistivities of the insulating layers constituting the sensors of Examples 1 to 6 are 0.3 W/m·K or more and $1 \times 10^{12}$ Ω·cm or more, respectively. That is, the insulating layers constituting the sensors of Examples 1 to 6 correspond to the insulating layers defined in the invention. Further, the type A durometer hardnesses and the tensile strengths of the insulating layers constituting the sensors of Examples 1 to 6 are less than 90 and 2.0 MPa or more, respectively. Therefore, the insulating layers are flexible and excellent in assemblability and durability. Among them, the insulating layers of Examples 1 to 5 each have a breaking elongation of 500% or more and are excellent in elongation characteristics. However, the insulating layer of Example 6 contains a large amount of inorganic filler, and therefore, has a breaking elongation lower than those of Examples 1 to 5. Meanwhile, each of the insulating layers of Examples 5 and 6 containing magnesium hydroxide powder as the inorganic filler has a volume resistivity larger than those of the insulating layers of the other Examples, which contain no magnesium hydroxide powder.

In contrast, the insulating layer constituting the sensor of Comparative Example 1 contains no thermoplastic elastomer. Therefore, the type A durometer hardness and the breaking elongation of the insulating layer are 90 and 400%, respectively. Thus, it can be seen that the insulating layer has poor flexibility. Moreover, the insulating layer constituting the sensor of Comparative Example 2 does not contain the inorganic filler having high thermal conductivity. Therefore, the thermal conductivity of the insulating layer is small. Furthermore, the insulating layer constituting the sensor of Comparative Example 3 contains carbon black, which is conductive, rather than the inorganic filler having high thermal conductivity. Thus, it is understood that the volume resistivity of the insulating layer is small, which is not suitable for the capacitive-coupling sensor of the invention.

As described above, it is confirmed that the insulating layer according to the invention can constitute a capacitive-coupling sensor providing excellent tactile sensation and having high thermal conductivity.

<Flame Retardancy Evaluation of Insulating Layer>

The flame retardancy of each insulating layer constituting each of the sensors of Examples and Comparative Examples. The flame retardancy evaluation was conducted based on the United States Federal Motor-Vehicle Safety Standard "FMVSS No. 302" (ISO 3795, JIS D 1201), which is a flammability test for automobile interior materials. In the flammability test, the burning rate of a test piece is measured after the test piece is fixed to a U-shaped jig and a flame of a burner is brought into contact with one end of the test piece. The burning rate is measured in a 254-mm burning section between a gauge mark A and a gauge mark B by setting the gauge mark A at 38 mm from the end to be in contact with the flame and setting the gauge mark B at 292 mm from that end. Then, an insulating layer that satisfies any of the following three requirements is determined to conform to the standard.

1. The test piece does not ignite or burning stops before the gauge mark A.
2. Burning stops within a burning distance of 51 mm and within 60 seconds.
3. The burning rate is 102 mm/min or less.

Table 2 shows the results of the flammability test.

TABLE 2

|  |  | Example 1 | Example 2 | Example 3 | Example 4 | Example 5 | Example 6 | Comparative Example 1 | Comparative Example 2 | Comparative Example 3 |
|---|---|---|---|---|---|---|---|---|---|---|
| Thermoplastic elastomer | Styrene-based | 100 | 50 | 100 | 100 | 100 | 100 | — | 100 | 100 |
|  | Olefin-based | 50 | 100 | — | 50 | 50 | 50 | — | 50 | 50 |
| Inorganic filler | Magnesium oxide | 200 | 200 | 200 | 300 | 150 | 200 | 200 | — | — |
|  | Magnesium hydroxide | — | — | — | — | 150 | 150 | — | — | — |

TABLE 2-continued

|  |  | Example 1 | Example 2 | Example 3 | Example 4 | Example 5 | Example 6 | Comparative Example 1 | Comparative Example 2 | Comparative Example 3 |
|---|---|---|---|---|---|---|---|---|---|---|
| Others | Low density polyethylene | — | — | 50 | — | — | — | 150 | — | — |
|  | Carbon black | — | — | — | — | — | — | — | — | 15 |
| Flame retardancy evaluation results (FMVSS Standard No. 302) | | Not conforming | Not conforming | Not conforming | Not conforming | Conforming | Conforming | Not conforming | Not conforming | Not conforming |

As shown in table 2, the insulating layers of Examples 5 and 6 containing magnesium hydroxide powder as the inorganic filler conform to the standard, but the insulating layers of the other Examples and Comparative Examples containing no magnesium hydroxide powder do not conform to the standard. From the above, it has been confirmed that an insulating layer containing a flame-retardant inorganic filler can constitute a capacitive-coupling sensor providing excellent tactile sensation, high thermal conductivity, and high flame retardancy.

DESCRIPTION OF REFERENCE SYMBOLS

1: capacitive-coupling sensor, 8: steering wheel, 10: detection electrode layer, 11: shield electrode layer, 12: insulating layer, 13: detection electrode layer, 20: core, 30: heater layer, 31: adhesion layer, 40: upholstery, 41: adhesive layer, 80: rim portion, 81: connecting portion

What is claimed is:

1. A capacitive-coupling sensor, comprising:
   a detection electrode layer that generates capacitance between the detection electrode layer and an object to be detected;
   a shield electrode layer; and
   an insulating layer disposed between the detection electrode layer and the shield electrode layer, wherein
   the detection electrode layer surrounds an entire circumference of the insulating layer,
   the insulating layer includes a thermoplastic elastomer,
   the insulating layer has a thermal conductivity of 0.3 W/m·K or more and a volume resistivity of $1\times10^{12}$ Ω·cm or more, and
   the capacitive-coupling sensor is disposed in a steering wheel.

2. The capacitive-coupling sensor according to claim 1, wherein the insulating layer includes an inorganic filler.

3. The capacitive-coupling sensor according to claim 2, wherein the inorganic filler includes particles having a thermal conductivity of 20 W/m·K or more.

4. The capacitive-coupling sensor according to claim 2, wherein the inorganic filler includes flame retardant particles.

5. The capacitive-coupling sensor according to claim 4, wherein the flame retardant particles are magnesium hydroxide.

6. The capacitive-coupling sensor according to claim 1, wherein a type A durometer hardness of the insulating layer is 35 or more and less than 90.

7. The capacitive-coupling sensor according to claim 1, wherein the insulating layer has a tensile strength of 0.1 MPa or more and a breaking elongation of 100% or more.

8. The capacitive-coupling sensor according to claim 1, wherein the thermoplastic elastomer is one or more selected from a styrene-based elastomer and an olefin-based elastomer.

9. The capacitive-coupling sensor according to claim 1, wherein at least either of the detection electrode and insulating layers or the shield electrode and insulating layers are fixed to each other without using an adhesive.

10. The capacitive-coupling sensor according to claim 1, wherein both the detection electrode and insulating layers as well as the shield electrode and insulating layers are fixed to each other without using an adhesive.

11. The capacitive-coupling sensor according to claim 1, wherein the detection electrode layer is made of conductive rubber or a conductive cloth.

12. The capacitive-coupling sensor according to claim 1, wherein the shield electrode layer is made of a conductive cloth.

13. The capacitive-coupling sensor according to claim 1, wherein
   the detection electrode layer and the shield electrode layer are made of conductive cloths, and
   at least part of the conductive cloths is embedded in the insulating layer.

14. The capacitive-coupling sensor according to claim 1, wherein
   the steering wheel includes a heater layer, and
   the shield electrode layer is disposed on a heater layer side.

15. The capacitive-coupling sensor according to claim 14, wherein the shield electrode layer and the heater layer are fixed to each other without using an adhesive.

16. A method for producing the capacitive-coupling sensor according to claim 13, the method comprising:
   placing the conductive cloth that serves as the detection electrode layer on a front surface of the insulating layer and placing the conductive cloth that serves as the shield electrode layer on a back surface of the insulating layer to form a laminate; and
   fusing the insulating layer to the conductive cloths by pressing the laminate in a front-back direction under heating.

17. The capacitive-coupling sensor according to claim 2, wherein the inorganic filler has at least either of magnesium oxide particles and aluminum oxide particles.

18. The capacitive-coupling sensor according to claim 1, wherein:
   at least one of the detection electrode layer and the shield electrode layer is made of a conductive cloth; and
   the conductive cloth is a woven fabric or a non-woven fabric of polyester fibers plated with copper or nickel.

19. A steering wheel comprising the capacitive-coupling sensor according to claim 1, a core, and a heater layer disposed between the capacitive-coupling sensor and the core, wherein
   in the capacitive-coupling sensor,
   the insulating layer includes an inorganic filler including particles having a thermal conductivity of 20 W/m·K or more, the thermoplastic elastomer of the insulating layer is one or more selected from a styrene-based elastomer and an olefin-based elastomer, and at least part of the detection electrode layer and the shield electrode layer is embedded in the insulating layer.

20. The capacitive-coupling sensor according to claim 1, wherein the insulating layer is a flexible layer that is a thickest layer in the capacitive-coupling sensor.

* * * * *